United States Patent
Homewood et al.

(10) Patent No.: US 8,890,177 B2
(45) Date of Patent: *Nov. 18, 2014

(54) SEMICONDUCTOR DEVICES MADE FROM CRYSTALLINE MATERIALS WITH LOCALLY MODIFYING ELECTRONIC AND OPTOELECTRONIC PROPERTIES

(75) Inventors: Kevin Peter Homewood, Guildford (GB); Russell Mark Gwilliam, Cranleigh (GB); Guosheng Shao, Guildford (GB)

(73) Assignee: University of Surrey, Guildford, Surrey (GB)

( * ) Notice: Subject to any disclaimer, the term of this patent is extended or adjusted under 35 U.S.C. 154(b) by 1545 days.

This patent is subject to a terminal disclaimer.

(21) Appl. No.: 11/770,838

(22) Filed: Jun. 29, 2007

(65) Prior Publication Data

US 2007/0263690 A1    Nov. 15, 2007

Related U.S. Application Data

(63) Continuation of application No. 10/297,115, filed as application No. PCT/GB01/02512 on Jun. 7, 2001, now Pat. No. 7,274,041.

(30) Foreign Application Priority Data

Jun. 8, 2000  (GB) .................................. 0014042.6

(51) Int. Cl.
  *H01L 27/15*  (2006.01)
  *H01L 33/00*  (2010.01)
  *H01L 31/12*  (2006.01)
  *H01L 33/02*  (2010.01)
  *H01L 33/34*  (2010.01)
  *H01S 5/20*   (2006.01)

(52) U.S. Cl.
  CPC .............. *H01L 33/34* (2013.01); *H01L 33/025* (2013.01); *H01L 33/0008* (2013.01); *H01L 33/0037* (2013.01); *H01S 5/2063* (2013.01)
  USPC .................. 257/86; 257/87; 257/94; 257/102; 257/103; 257/E33.005

(58) Field of Classification Search
  CPC ... H01L 33/34; H01L 33/0008; H01L 33/025; H01L 33/0054; H01L 33/305; H01L 33/343; H01L 29/207; H01L 29/66136
  USPC ................. 257/86, 87, 94, 102, 103, E33.005
  See application file for complete search history.

(56) References Cited

U.S. PATENT DOCUMENTS 4,322,253 A   3/1982  Pankove et al.
4,684,964 A   8/1987  Pankove et al.
(Continued)

FOREIGN PATENT DOCUMENTS

GB   2318680 A    4/1998
JP   04-280479    10/1992
(Continued)

OTHER PUBLICATIONS

Sveinbjornsson et al., Room temperature electroluminescence from dislocation-rich silicon, Applied Physics Lett., vol. 69 No. 18, Oct. 28, 1996.

(Continued)

*Primary Examiner* — Shouxiang Hu
(74) *Attorney, Agent, or Firm* — Leydig, Voit & Mayer, Ltd.

(57) ABSTRACT

An electronic or optoelectronic device fabricated from a crystalline material in which a parameter of a bandgap characteristic of said crystalline material has been modified locally by introducing distortions on an atomic scale in the lattice structure of said crystalline material and the electronic and/or optoelectronic parameters of said device are dependent on the modification of said bandgap is exemplified by a radiation emissive optoelectronic semiconductor device which comprises a junction (10) formed from a p-type layer (11) and an n-type layer (12), both formed from indirect bandgap semiconductor material. The p-type layer (11) contains a array of dislocation loops which create a strain field to confine spatially and promote radiative recombination of the charge carriers.

6 Claims, 4 Drawing Sheets

(56) References Cited

Figure 1:
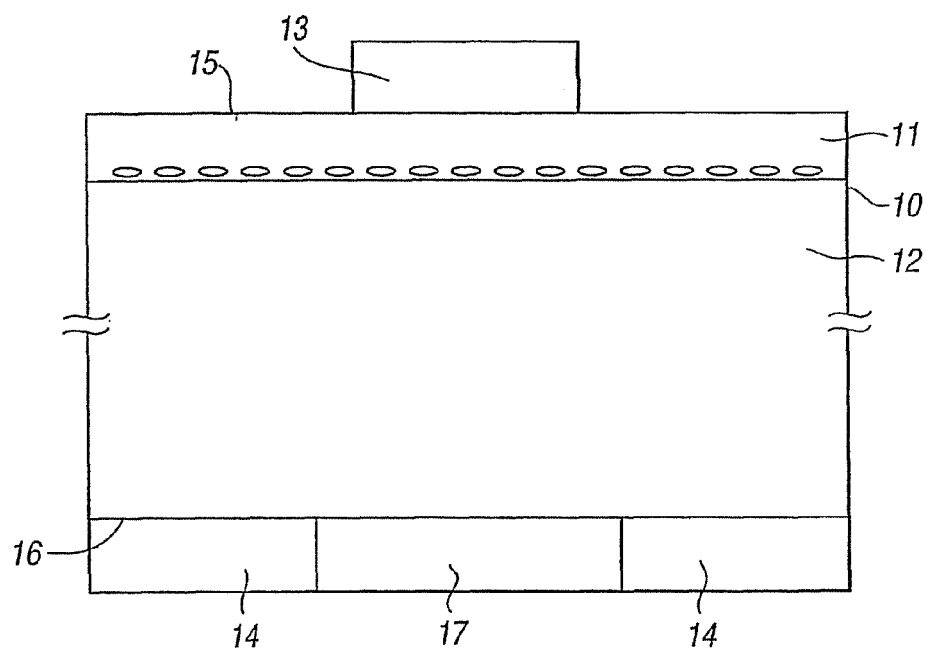

U.S. PATENT DOCUMENTS 5,077,143 A * 12/1991 Barraclough et al. ........ 428/690
6,288,415 B1    9/2001 Leong et al.
7,274,041 B2 *  9/2007 Homewood et al. ............ 257/87

FOREIGN PATENT DOCUMENTS

JP   2000-357818     12/2000
JP   2000-357818 A   12/2000

OTHER PUBLICATIONS

Ng et al., An efficient room-temperature silicon-based light-emitting diode, Nature, vol. 410, Mar. 8, 2001.

Declaration of Kevin Homewood dated May 31, 2006 with attachments: (Reference 1, Extract from D.B. Williams and C B Carter, Transmission Electron Microscopy, Plenum Press 1996; Reference 2, Optical fibre communications: Principles and Practice, John M. Senior, 1951, pp. 62-64; Reference 3, Optoelectronics: an introduction, J. (John) Wilson, 1939, pp. 281, 315-317; Reference 4, Curriculum Vitae of Kevin Peter Homewood, 6 pp.; Reference 5. Refereed Journal Publication List, Invited Conference Presentations, Kevin P. Homewood, 12 pp.).

Jasper et al., "The effect of implantation, energy and dose on extended defect formation for MeV phosphorus implanted silicon," Applied Physics Letters, Oct. 25, 1999, pp. 2629-2631, vol. 75. No. 17, American Institute of Physics.

Bonafos et al., "The effect of the boron doping level on the thermal behavior of end-of-range defects in silicon," *Applied Physics Letters*, 71(3): 365-367 (1997).

Jones et al., "A Systematic Analysis of Defects in Ion-Implanted Silicon, "*Applied Physics A.*, 45(1): 1-34 (1988).

Stolk et al., "Implantation and transient born diffusion: the role of the silicon self-interstitial," *Nuclear Instruments and Methods in Physics Research B*, 96: 187-195 (1995).

* cited by examiner

SEMICONDUCTOR DEVICES MADE FROM CRYSTALLINE MATERIALS WITH LOCALLY MODIFYING ELECTRONIC AND OPTOELECTRONIC PROPERTIES

This invention relates to electronic and optoelectronic devices fabricated from crystalline materials and a method of making same. It finds particular application in radiation emissive optoelectronic devices made from semiconductor materials initially having an indirect bandgap.

Crystalline materials consist of arrays of atoms arranged in regular patterns. The electrical charge associated with the component electrons and nuclear particles create within the crystal an electric field which varies locally with a periodicity determined by the spacing of the atoms within the crystal.

Semiconductors and insulators formed of crystalline materials are characterised by so-called conduction and valence bands by way of which charge carriers propagate under the influence of an applied field. The energy separation of the conduction and valence bands is determined by the nature and size of the constituent atoms of the crystal. In some materials a minimum in the valence band may be opposite a maximum in the conduction band, whilst in others is displaced therefrom. These are known respectively as direct and indirect bandgap materials.

The nature and magnitude of a material's band structure are parameters which influence the electronic and optoelectronic devices fabricated therefrom. For example, diodes made from semiconductors with wide bandgaps will tend to have higher breakdown voltages because these materials will have fewer thermally-generated charge carriers at any given temperature and therefore will be less susceptible to avalanche effects. Gallium arsenide will be a material of choice for radiation-generating devices because it has a direct bandgap. Silicon, on the other hand, has been considered fundamentally unsuitable for use as an emitter of radiation. This is because silicon is an indirect bandgap material in which fast, non-radiative recombination processes completely dominate the much slower radiative recombination processes. Indeed in bulk silicon, at room temperature, radiation emission is almost entirely absent.

With the continuing and rapid development of computer processors, the constant demand for increased processing power and speed and reduced size necessitates an ever increasing complexity of the interconnecting metallisations. It is anticipated that this complexity will eventually present an insurmountable obstacle to further development (the breakdown of Moore's Law) because electrons will spend a disproportionate amount of time in the metallisations instead of in the components they interconnect, thereby curtailing processing power and speed.

Optoelectronic circuits based on silicon technology offer a way forward because optical coupling is many orders of magnitude faster than connections based on the diffusion of charge carriers. However, this approach requires development of an efficient room temperature radiation-emissive device based on silicon. Clearly, such a device could be used to enhance the functionality of other silicon devices and could lead to implementation of all-silicon integrated optoelectronic systems.

By introducing a strain field created by local distortions on an atomic scale in the structure of a semiconducting or insulating crystal, we have found that it is possible locally to modify the properties of the associated bandgap. One consequence of this is that it has proved feasible to fabricate radiation-emitting devices from materials such as silicon.

A preferred mechanism for the creation of a strain field is the formation of an array of dislocation loops.

According to the present invention there is provided an electronic or optoelectronic device fabricated from a crystalline material in which a parameter of a band structure characteristic of said crystalline material has been modified locally by introducing distortions on an atomic scale in the lattice structure of said crystalline material and wherein a desired electronic or optoelectronic parameter of said device is obtained as a result of said the modification of the band structure.

According to a particular aspect of the invention there is provided a radiation-emissive optoelectronic device comprising a junction formed, at least in part, from a region of p-type indirect bandgap semiconductor material and/or a region of n-type indirect bandgap semiconductor material, wherein said junction incorporates means effective, in operation of the device, to confine spatially, and thereby promote, radiative recombination of charge carriers.

Said charge carrier confinement means is preferably a strain field.

In a preferred implementation of the invention, said strain field is preferably created by intrinsic extended lattice defects such as an array of dislocation loops.

Depending on the materials used, devices according to the invention may emit radiation at different wavelengths in a range extending from the infra-red to the ultra violet In a preferred embodiment, the device comprises a p-n junction formed from a region of n-type silicon and a region of p-type silicon. In operation, this device emits radiation in the infra red at a wavelength of about 1150 nm. As will be demonstrated a silicon-based device of this kind may be readily manufactured on a commercial scale using processing techniques common to ULSI technology.

Devices according to the invention have the additional advantage that optimum operating efficiency i.e. maximum total electroluminescence intensity is achieved at or around room temperature. Thus, the devices are particularly well suited for use in applications such as the aforementioned According to another aspect of the invention there is provided a method of making a radiation-emissive optoelectronic semiconductor device including the steps of forming a junction having at least a region of p-type indirect bandgap semiconductor material and/or a region of n-type indirect bandgap semiconductor material, and incorporating in the junction means effective, in operation of the device, to spatially confine, and thereby promote radiative recombination of charge carriers.

In a preferred embodiment the junction is formed, at least in part, from a region of p-type indirect bandgap semiconductor material and a region of n-type indirect bandgap material.

Figure 2:
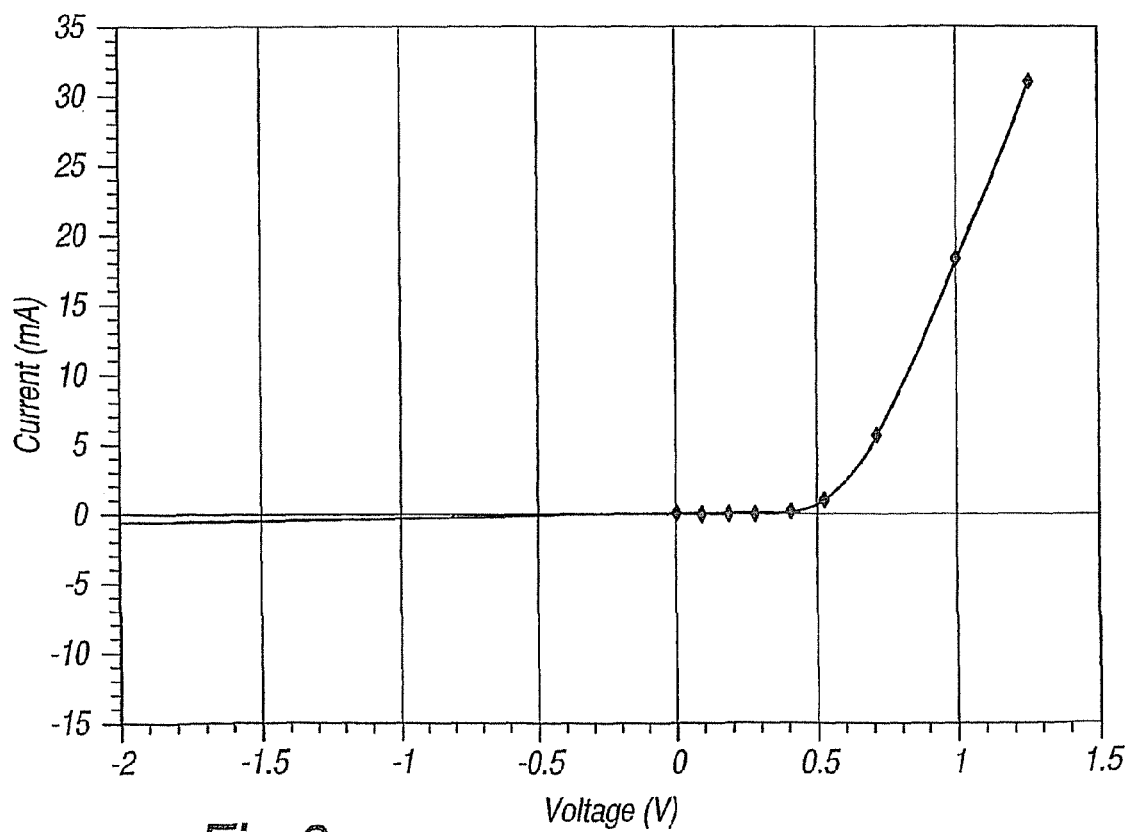
Figure 3:
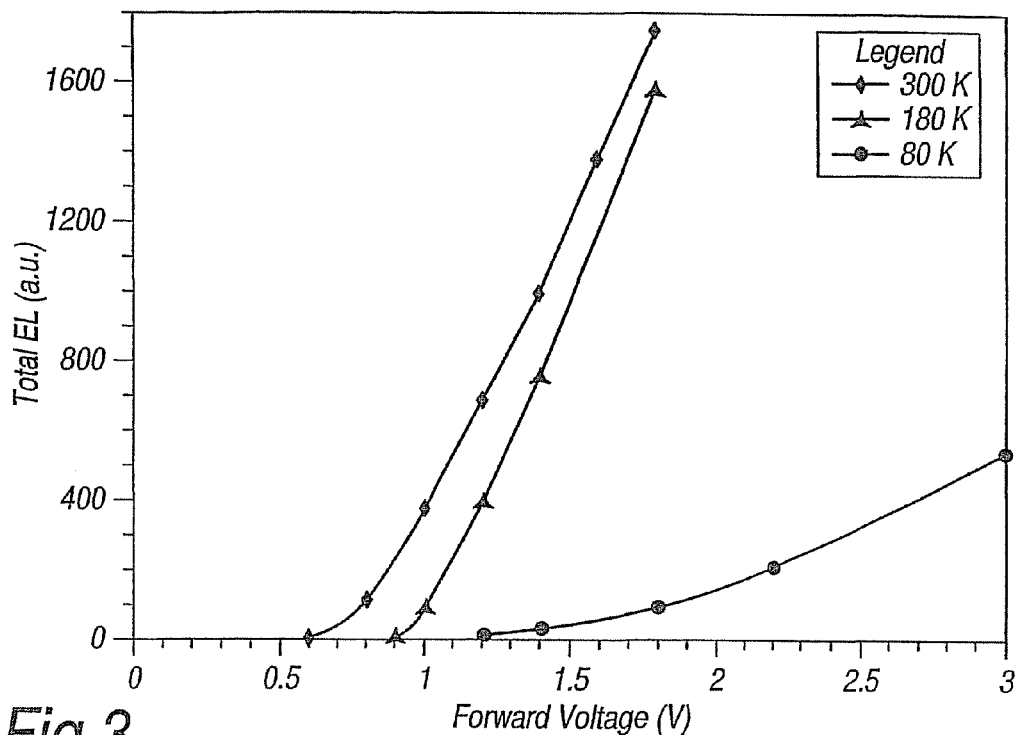
Figure 5:
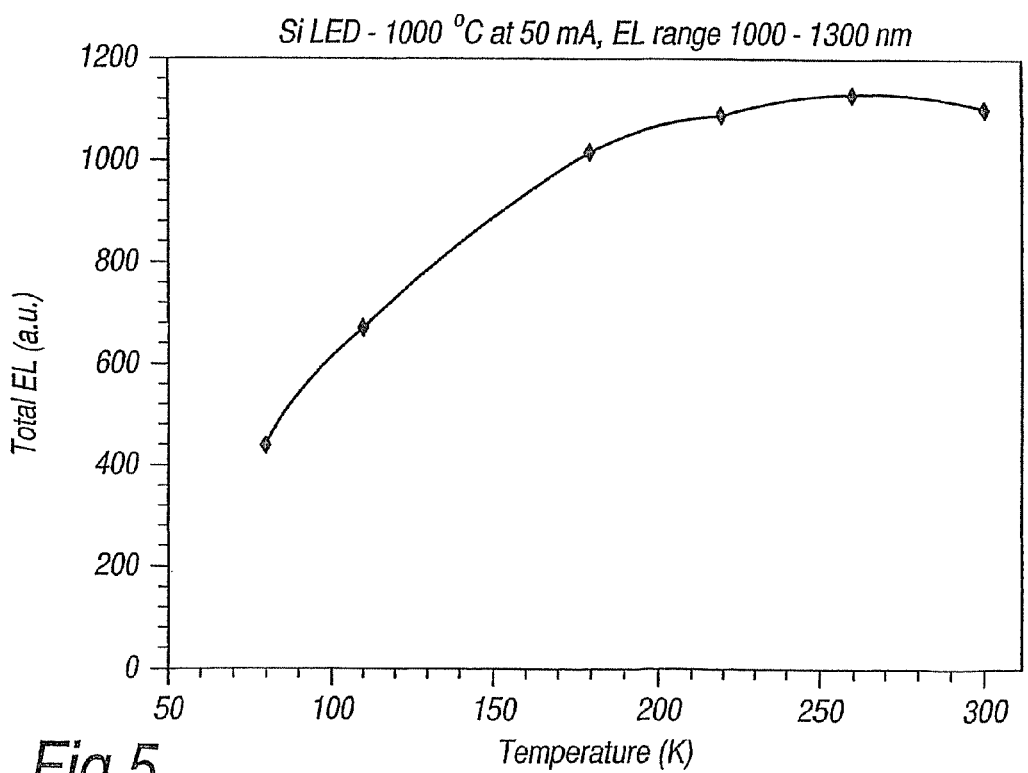
Figure 4:
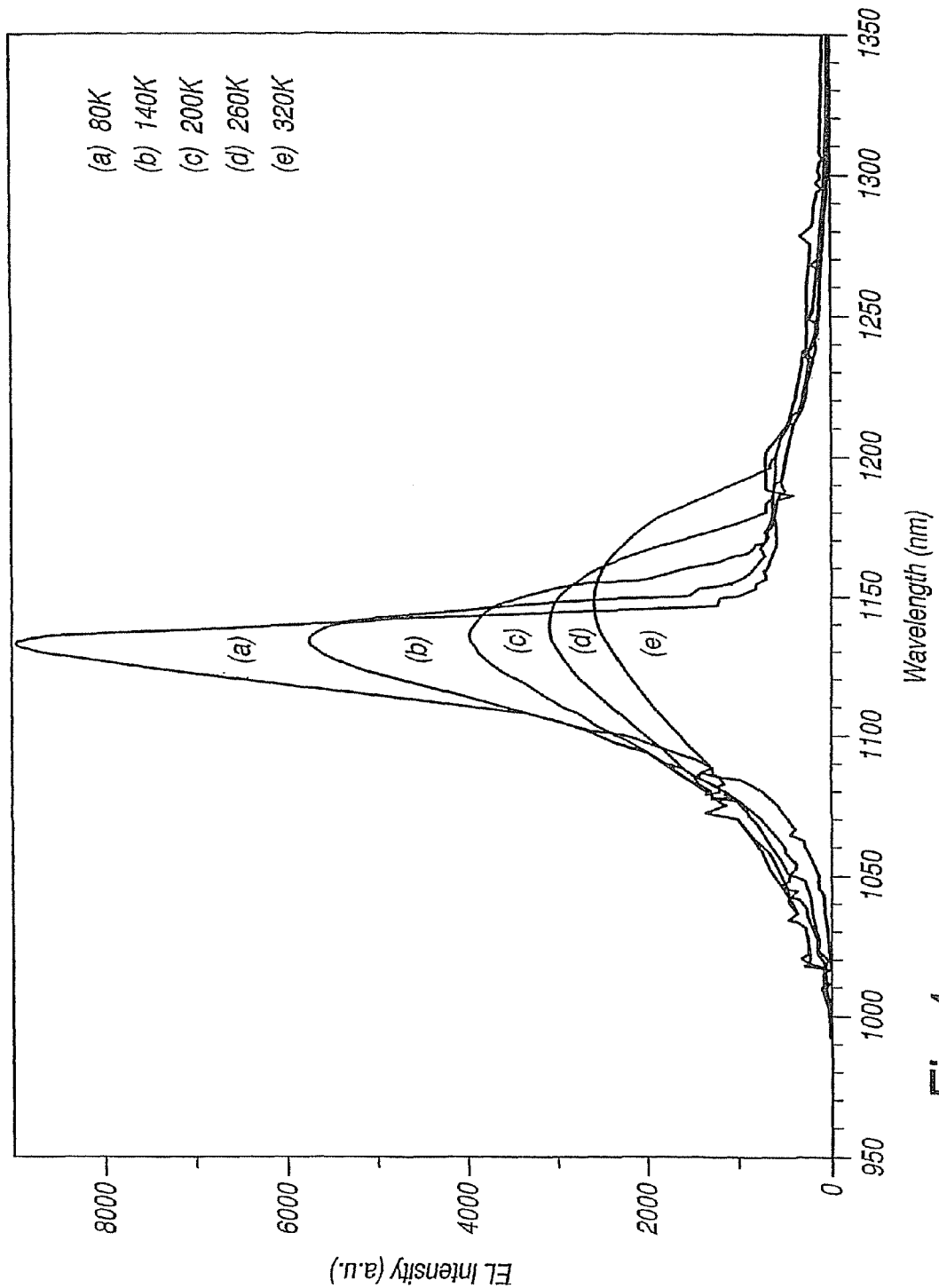
Figure 6A:
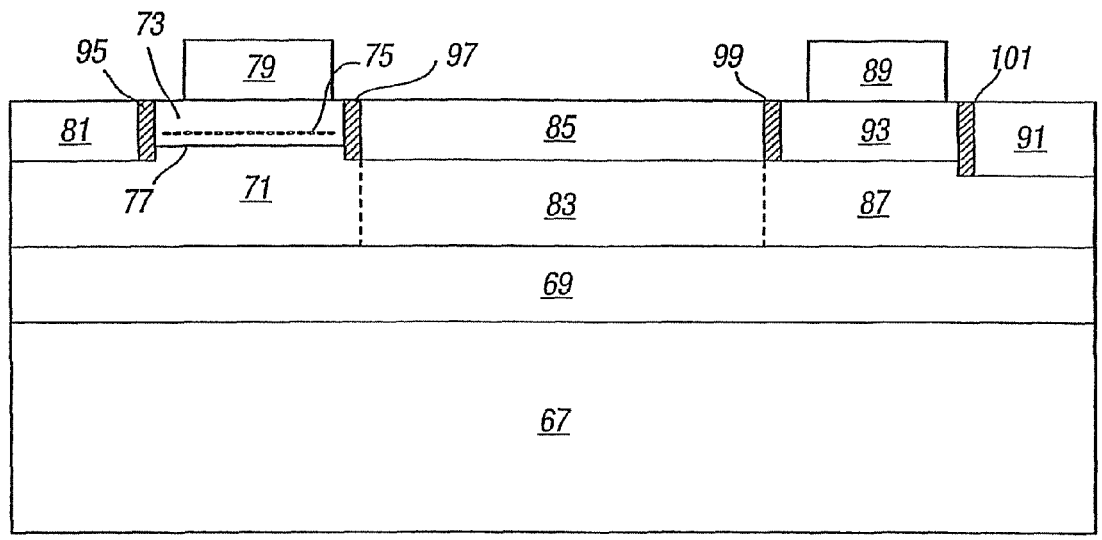
Figure 6B:
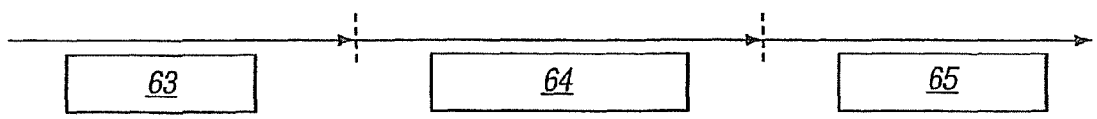

Embodiments of the invention are now described, by way of example only, with reference to the accompanying drawings of which:

FIG. 1 shows a schematic transverse sectional view through a radiation-emissive optoelectronic device according to the invention, FIG. 2 is a plot of current I as a function of bias voltage V obtained at room temperature from the device of FIG. 1, FIG. 3 shows plots of integrated electroluminescence intensity as a function of forward bias voltage V obtained from the device of FIG. 1 operating at 80K, 180K and 300K, FIG. 4 shows plots of electroluminescence intensity as a function of wavelength obtained from the device of FIG. 1 operating at 80K, 140K, 200K, 260K and 320K and FIG. 5 shows a plot of integrated electroluminescence intensity as a function of temperature derived from the plots of FIG. 4, and FIGS. 6a and 6b are respectively a diagrammatic cross-section and block diagram of an optoelectronic integrated circuit in accordance with a specific embodiment of the invention.

Referring now to FIG. 1, the radiation-emissive optoelectronic device has the form of a diode comprising a p-n junction 10 defined by a region 11 of p-type silicon and a region 12 of n-type silicon. In this implementation of the invention, the p-type region 11 is doped with boron (13) and the n-type region 12 is doped with arsenic (As). However, it will be appreciated that other suitable dopants known to those skilled in the art could alternatively be used.

Ohmic contacts 13,14 are provided on the front and back surfaces 15,16 of the device enabling a bias voltage to the applied across the junction 10. In this embodiment, the ohmic contact 13 provided on the front surface 15 of the device is made from aluminium (Al) and the ohmic contact 14 provided on the back surface 16 of the device is made from electric gold/antimony alloy (AuSb). Contact 14 has a central window 17 through which electroluminescence produced by the device can pass.

The junction region 10 incorporates a strain field. In this embodiment, the strain field is created by extended intrinsic lattice defects such as an array of dislocation loops situated in the region 11 of p-type silicon, as shown schematically in FIG. 1.

The effect of the strain field is locally to modify the structure of the silicon bandgap. More specifically, the strain field around each extended lattice defect gives rise to a three-dimensional potential well which varies inversely as a function of distance from the core of the dislocation loop. It is believed that the combined effect of the potential wells is to cause spatial confinement of mobile charge carriers thereby significantly reducing their diffusion to point defects in the silicon where fast, non-radiative recombination processes would otherwise take place. It has been found that the effect of a strain field of the kind described is to suppress non-radiative recombination of charge carriers, which is usually the dominant process, and to promote radiative recombination of charge carriers which, hitherto, has been almost entirely absent in devices made from indirect bandgap materials such as silicon. As will be described in greater detail hereinafter, when a forward bias voltage is applied across junction 10 significant amounts of electroluminescence are generated by the device.

Promotion of the radiative recombination process is enhanced if the array A of dislocation loops is periodic (or nearly so) in the lateral directions of junction; that is, in directions parallel to the interface of the p-type and n-type regions 11,12 of the junction. In this embodiment, the array of dislocation loops has a periodicity of around 100 nm and is located in region 11 at a depth of about 100 nm.

The device described with reference to FIG. 1 was fabricated by implanting boron atoms into a device grade substrate of n-type silicon having a resistivity of 2-4 ohm-cm using a conventional ion implantation process. In this embodiment, the implantation dose was $1 \times 10^{15}$ cm$^2$ and the implantation energy was 30 keV.

The implanted substrate was then annealed in a nitrogen atmosphere for about 20 minutes at 1000° C. The ohmic contacts 13,14 were then applied to the substrate by evaporation or by another suitable deposition process and sintered at 360° C. for about two minutes.

In this implementation, the implanted boron atoms serve dual functions so as to reduce the number of processing steps; that is, the implanted boron atoms are used as dopant atoms defining the p-type region 11 of the junction and they are also used to create dislocations in that region. The subsequent annealing step activates the implanted dopant atoms and also leads to aggregation of the dislocations which causes the required dislocation loop array to form.

In another implantation, the array of dislocation loops is formed independently of the doping process by separately implanting a different species of atom e.g. silicon atoms. Again, an implantation energy of about 30 keV is used.

In both the foregoing implementations, the fabrication process is tailored deliberately to introduce dislocations into the substrate (a step usually considered undesirable) to enable the required array of dislocation loops to form during the annealing step.

It will be appreciated that the techniques employed in the described fabrication processes (i.e. ion implantation, evaporation, annealing) are entirely compatible with existing USLI technology. Accordingly, the device described could be readily fabricated on standard fabrication lines.

In order to investigate the operating characteristics of the described device a bias voltage V was applied across the ohmic contacts 13,14 and the electrical current I between the contacts was measured. FIG. 2 is a plot showing the variation of current I as a function of voltage V and demonstrates that the device exhibits the characteristic behaviour of a diode.

To investigate radiation emissivity, the device was mounted in a holder inside a continuous flow, liquid nitrogen cryostat. Electroluminescence produced by the device was focused into a conventional half meter spectrometer and detected using a liquid nitrogen cooled germanium p-i-n detector.

FIG. 3 shows plots of the integrated or total electroluminescence intensity as a function of forward bias voltage detected at 80K, 180K and 300K and demonstrates how the onset of electroluminescence is observed as the diode turns on. FIG. 4 shows the full electroluminescence spectra obtained at 80K, 140K, 200K, 260K and 320K and FIG. 5 shows a plot of the integrated or total electroluminescence intensity as a function of temperature derived from the electroluminescence spectra of FIG. 4. Referring to FIG. 4, the low temperature spectrum, obtained at 80K, exhibits the structural features expected for radiative emission at the silicon band edge. The room temperature spectrum peaks at the wavelength 1150 nm and has a full width at half maximum of 80 nm. Referring to FIG. 5, it can be seen that the integrated or total electroluminescence steadily increases as a function of temperature, an effect thought to be attributable to the increasing role of phonon coupling in the radiative recombination process. Accordingly, optimum emissivity is achieved at room temperature and above. This is in sharp contrast to known systems proposed for radiation emission in silicon, for which electroluminescence quenches strongly with increasing temperature making a practical room temperature device problematical.

It will be understood that although the device described with reference to FIGS. 1 to 5 comprises a silicon homojunction, the present invention embraces devices comprising homojunctions made from other indirect bandgap materials including silicon alloys. For example, devices comprising homojunctions made from materials ranging from 100% Ge, through germanium/silicon alloys (Ge/Si), through 100% Si through silicon carbide (SiC) alloys, will be emissive of radiation at different respective wavelengths in a range extending from the near infra-red (including the regions at and around 1.3 μm and 1.5 μm) up to the ultraviolet.

It will be understood that the present invention also embraces devices comprising heterojunctions e.g. silicon and germanium.

It will be understood that throughout this specification the expression p-n junction is intended to embrace a p-i-n junction in which a region of intrinsic semiconductor material (e.g. intrinsic silicon) is sandwiched between the p-type and n-type regions of the junction.

It is envisaged that radiation-emissive optoelectronic devices according to the invention will have wide applicability; particularly, though not exclusively, in applications requiring efficient room temperature electroluminescence. All-silicon devices according to the invention may find application as radiation sources in all-silicon integrated optical systems.

Typically, devices fabricated in accordance with this invention may be incorporated in optoelectronic integrated circuits. Such circuits may incorporate regions exhibiting a photonic bandgap.

Referring now to FIGS. 6a and 6b, a planar optoelectronic integrated circuit 61 comprises a silicon-based optical emitter 63, which may be either a non-coherent light-emitting diode (LED) Dr a laser, coupled by way of a planar waveguide 64 to a silicon-germanium (SiGe) optical detector 65. The circuit is formed on a silicon substrate 67 incorporating a buried silicon dioxide layer 69. The optical emitter is formed in an n-type region 71 having a p-type region 73 formed by ion implantation with an array of dislocation loops 75 adjacent a p-n junction 77. Metallic contacts 79,81 are respectively attached to p+ and n+ surface areas.

The waveguide region 83 is bounded by the buried oxide layer 69 and a region 85 containing an array of regions of lower refractive index to create a photonic band gap, thereby modifying the wavelength transmission characteristics of the waveguide. Under some circumstances, these transmission characteristics may be further modified by the incorporation of an array of dislocation loops within the photonic band gap region.

The optical detector 65 includes a SiGe p-n junction region 87 formed either by ion beam synthesis involving implanation of germanium into the silicon substrate or selective epitaxy. Contacts 89,91 are made to the active region. A local p+ implantation 93 facilitiates this.

The individual components of the integrated circuit are separated by oxide-filled isolating trenches 95,97,99,101.

Vertical integration could also be implemented using an adapation of these techniques, leading to three-dimensional integration capability. Optically active regions incorporating impurities such as erbium or other rare earths or, for example, carbon with quasi-stable transitions may also be used as a building-block in the fabrication of the integrated circuits or even discrete components.

In yet another application, a radiation-emissive optoelectronic device according to the invention may be used as the radiation source of an injection laser. In this application, the device may include one or more additional region of p-type and/or n-type and/or undoped semiconductor material arranged to provide carrier population inversion and/or to define an optical cavity for the emitted radiation. Examples of such lasers include the separate confinement heterostructure (SCH) laser and the large optical cavity (LOC) laser.

Although annealing has been described as having been carried out at a temperature of 1000° C. for twenty minutes, alternative combinations of time and temperature maybe employed. The combination will be such as to form and stabilise the strain-inducing local modifications to the crystal structure and may even embrace flash annealing at temperatures close to the melting point of the material.

Under some circumstances it may be desirable to perform multiple ion implantations to form arrays of dislocation loops or other strain-inducing microstructures at different distances from the surface of the crystal. Such a technique imparts a further degree of freedom in the topography of the resulting devices.

The technique may be utilised to modify or fine-tune the characteristics of devices produced by other methods, for instance, photonic bandgap regions produced by arrays of material of different refractive index.

The technique may also be confined locally in a substrate by using photolithographic masking processes.

The invention claimed is:

1. A radiation-emissive optoelectronic device comprising a junction formed, at least in part, from a region of p-type indirect band-gap semiconductor material and/or a region of n-type indirect band gap semiconductor material, wherein said junction incorporates an array of dislocation loops creating a strain field, the strain field being effective, in operation of the device, to confine spatially charge carriers, and thereby promote radiative recombination of said charge carriers giving rise to a dominant peak in an entire electroluminescence spectrum of the device, the dominant peak being attributable to the presence of the array of dislocation loops.

2. A device as claimed in claim 1 wherein said junction is a homojunction.

3. A device as claimed in claim 2 wherein said p-type indirect bandgap semiconductor material is p-type silicon and said n-type indirect bandgap semiconductor material is n-type silicon.

4. A device as claimed in claim 3 wherein said strain field is created by said array of dislocation loops formed in said region of p-type silicon.

5. A device as claimed in claim 3 wherein said region of p-type silicon is doped with boron.

6. A device as claimed in claim 1 wherein said junction is a heterojunction.

* * * * *